United States Patent
Coignus

(10) Patent No.: US 9,627,074 B2
(45) Date of Patent: Apr. 18, 2017

(54) METHOD FOR DETERMINING AN OPTIMAL VOLTAGE PULSE FOR PROGRAMMING A FLASH MEMORY CELL

(71) Applicant: COMMISSARIAT A L'ENERGIE ATOMIQUE ET AUX ENERGIES ALTERNATIVES, Paris (FR)

(72) Inventor: Jean Coignus, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/132,862

(22) Filed: Apr. 19, 2016

(65) Prior Publication Data

US 2016/0314845 A1    Oct. 27, 2016

(30) Foreign Application Priority Data

Apr. 21, 2015   (FR) .................................... 15 53558

(51) Int. Cl.
  *G11C 16/12*    (2006.01)
  *G11C 16/04*    (2006.01)
(52) U.S. Cl.
  CPC .......... *G11C 16/12* (2013.01); *G11C 16/0408* (2013.01); *G11C 2216/02* (2013.01)
(58) Field of Classification Search
  CPC ............................ G11C 16/12; G11C 16/0408
  See application file for complete search history.

(56) References Cited

U.S. PATENT DOCUMENTS

| | | | |
|---|---|---|---|
| 5,856,946 A | 1/1999 | Chan et al. | |
| 6,040,996 A | 3/2000 | Kong | |
| 7,319,615 B1* | 1/2008 | Park ....................... | G11C 16/16 365/185.14 |
| 7,468,917 B2* | 12/2008 | Sugawara .............. | G11C 16/12 365/185.14 |
| 7,656,712 B2* | 2/2010 | Lisi ..................... | G11C 11/5628 365/185.18 |
| 8,902,627 B1 | 12/2014 | Pesavento et al. | |
| 2006/0164898 A1 | 7/2006 | Pio | |

OTHER PUBLICATIONS

Search Report as issued in French Patent Application No. 1553558, dated Mar. 7, 2016.
Della Marca, V., et al., "Push the flash floating gate memories toward the future low energy application," Solid-State Electronics, vol. 79, 2013, pp. 210-217.

* cited by examiner

*Primary Examiner* — Tri Hoang
(74) *Attorney, Agent, or Firm* — Pillsbury Winthrop Shaw Pittman LLP

(57) ABSTRACT

A method for determining an optimal voltage pulse for programming a flash memory cell, the optimal voltage pulse being defined by a voltage ramp from a non-zero initial voltage level during a programming duration, wherein the method takes into account a set of parameters including a programming window target value and a drain current target value of the memory cell.

7 Claims, 6 Drawing Sheets

$Id\ (V_{FG})\ @Vd=Vd_{PROG}\ =\ Id_{TREQ}\ (Vg_{TREQ})\ @\ Vd_{TREQ}=Vd_{PROG}$

METHOD FOR DETERMINING AN OPTIMAL VOLTAGE PULSE FOR PROGRAMMING A FLASH MEMORY CELL

CROSS-REFERENCE TO RELATED APPLICATIONS

This application claims priority to French Patent Application No. 1553558, filed Apr. 21, 2015, the entire content of which is incorporated herein by reference in its entirety.

TECHNICAL FIELD

The present invention belongs to the field of floating gate non-volatile memories and more particularly concerns the electrical programming conditions of a flash memory cell.

STATE OF THE PRIOR ART

An "EEPROM-Flash" memory (commonly called flash memory) is conventionally formed of a plurality of identical memory cells which can be electrically programmed in an individual manner, a large number of cells, called block, sector or page, being able to be erased simultaneously and electrically.

FIG. 1 schematically represents a flash memory cell 10 of 1T-NOR type, as well as the mechanism for programming this cell.

The flash memory cell 10 is comprised of a NMOS transistor including a substrate 11 made of semiconductor material, a source region 12 and a drain region 13 formed in the substrate 11, and a control gate 14. This transistor further comprises an electrical charge storage site 15, called floating gate, formed for example of a polysilicon layer arranged between two oxide layers 16 and 17. The floating gate 15 is situated between the control gate 14 and the substrate 11. The substrate 11, the source 12, the drain 13 and the control gate 14 constitute control electrodes of the memory cell 10, noted respectively B (for "bulk"), S, D and G in FIG. 1.

The programming, also called writing, of a flash memory cell is carried out by applying simultaneously a high voltage Vg to the control gate 14, for example between 7 V and 10 V, and a more moderate voltage Vd to the drain 13 of the floating gate transistor, for example between 3 V and 5 V (the substrate 11 and the source 12 are connected to the ground). As it is shown schematically in FIG. 1, these voltages cause the appearance of a conduction channel in the substrate 11, between the source 12 and the drain 13, and a source-drain current, carried by high energy electrons (called "hot" electrons). These electrons travel through the channel from the source 12 in the direction of the drain 13. Certain electrons enter into collision with the atoms of the substrate 11 situated near to the drain 13, which leads to a phenomenon of ionization by impact of these atoms and to the injection of electrons into the floating gate 15, by tunnel effect through the oxide layer 17 (called "tunnel oxide").

The written or erased state of the memory cell 10 depends on the concentration of electrons trapped in the floating gate 15. In the written state (logical level '1'), the floating gate 15 is filled with electrons. The threshold voltage of the floating gate transistor is high (typically, between 6 V and 9 V). Conversely, in the erased state (logic level '0'), the floating gate 15 is empty of electrons. The threshold voltage of the transistor is low (typically, between 2 V and 4 V).

During the programming of the memory cell 10, a minute part of the electrons from the source 12 is trapped in the floating gate 15 (around 1 electron trapped for $10^6$ electrons injected into the channel). The other part of the electrons, collected by the drain 13, constitutes the drain current Id underlying the electrical consumption of the memory cell 10. The energy Ec consumed by the memory cell 10 during its programming is written:

$$Ec = \int_{t_{pulse}} Vd(t) \cdot Id(t) \cdot dt = Vd_{PROG} \cdot \int_{t_{pulse}} Id(t) \cdot dt$$

where Vd(t) is the voltage applied to the drain over time, Id(t) is the drain current over time and $t_{pulse}$ is the duration of the programming operation. The duration $t_{pulse}$ is generally comprised between 1 µs and 10 µs. During the entire programming duration, the voltage Vd(t) is a constant, noted above $Vd_{PROG}$ (here $Vd_{PROG}$=3-5 V).

Apart from the energy consumed Ec, it is customary to define two other parameters to characterize the programming of a flash memory cell:

- the maximum value $Id_{MAX}$ of the drain current of the memory cell during programming; and
- the programming window (PW), which corresponds to the difference in the threshold voltages between the written (or "programmed") state and the erased state of the memory cell.

A dynamic measurement of the drain current Id during the programming of the flash memory cell allows to obtain two of these parameters: the energy consumed Ec and the maximum value $Id_{MAX}$ of the drain current. To carry out this measurement, an appliance known as a PIV (Pulsed I-V system) or FMU (Fast Measurement Unit) is generally used which allows to generate voltage pulses on the drain 13 and on the control gate 14, while dynamically measuring currents between 1 µA and 10 mA (typically with a sampling duration of the order of 10 ns).

FIG. 2 is an example of dynamic measurement of the drain current as a function of time, Id(t), during programming of the memory cell 10. The voltage pulse 20 applied to the control gate 14 of the memory cell 10, in other words the potential Vg(t), is superimposed on the plot of the current Id(t). The voltage pulse 20 has a conventional shape, globally rectangular. It comprises a plateau 21 at around 8.5 V (Vg(t)=8.5 V). The programming duration $t_{pulse}$, equal to the duration of the pulse 20, is approximately equal to 3 µs. The drain is biased to a potential Vd equal to 4 V (Vd=$Vd_{PROG}$=4 V) during the entire programming duration.

It may be noted in FIG. 2 that the drain current Id decreases in the course of programming, after having reached the maximum value $Id_{MAX}$ at the start of the pulse 20. This is due to the fact that the electrical charge of the floating gate 15 diminishes progressively while filling up with electrons, which brings about an increase in the threshold voltage of the floating gate transistor.

As may be seen in FIG. 2, the decrease in the drain current Id is much more rapid at the start of programming than at the end of programming. In other words, the programming speed is much faster at the start than at the end of the voltage pulse 20. Yet the programming speed directly influences the duration of programming necessary to reach a programming window threshold value. In fact, the faster the programming speed, the greater the current of electrons to the floating gate (i.e. through the tunnel oxide) and the faster the floating gate fills with electrons.

This variation in programming speed is due to the fact that a rectangular voltage pulse is used to bias the control gate of the memory cell. Another drawback of using a pulse of rectangular shape is the current peak P that occurs at the start of the pulse 20 (FIG. 2). This current peak is detrimental for the memory cell, because it determines in what way needs to be dimensioned the floating gate transistor and the charge pumps which supply the cell with current. The higher the current $Id_{MAX}$ reached by this peak, the more the floating gate transistor and the charge pumps of the memory cell occupy a considerable circuit surface area. With a rectangular voltage pulse, the charge pumps supply current $Id_{MAX}$ during several nanoseconds only. The rest of the time they are under-used (and thus over-dimensioned).

The optimization of the programming of a memory cell depends on the application that is targeted and generally results from a compromise between three programming parameters: the energy consumed Ec, the maximum value $Id_{MAX}$ of the drain current and the programming window PW. For example, for an energy saving memory, it will be sought to reduce as much as possible the energy consumed Ec, to the detriment of the maximum value $Id_{MAX}$ of the drain current and/or the programming window PW. Conversely, for a memory with high integration density, the floating gate transistor of the memory cell must be as small as possible. It is thus sought to reduce the maximum drain current $Id_{MAX}$ on which the dimensions of the transistor depend. In return, the energy Ec consumed by the cell will be greater.

To optimize the programming of the memory cell taking account of the targeted application, it is possible to adapt its manufacturing method and/or play on the shape of the voltage pulse applied to the control gate.

In the document ["Push the flash floating gate memories toward the future low energy application", V. Della Marca et al., Solid-State Electronics 79, pp. 210-217, 2013], different shapes of voltage pulse are studied. The pulses are of rectangular type (box pulse), that is to say formed of a plateau, of ramp type or constituted of the combination of a ramp and a plateau. For each pulse shape, its impact on the energy consumption Ec, the programming window PW and the maximum drain current $Id_{MAX}$ is determined experimentally.

The results of this study allows to choose the shape of voltage pulse giving the best compromise between the three programming parameters (within the limits of the specifications set by the manufacturer according to the targeted application), and thus to determine the optimal programming conditions. It is just however an a posteriori approach to determine the programming conditions. This approach requires testing numerous voltage pulses to obtain therefrom one which satisfies the three programming parameters.

SUMMARY OF THE INVENTION

There thus exists a need to provide a simple and rapid method for determining the voltage pulse to apply to the control gate of a NOR type flash memory cell to program this cell in an optimal manner, taking account of a set of parameters including a programming window target value and a drain current target value of the memory cell.

According to the invention, the optimal voltage pulse is defined by a voltage ramp, from a non-zero initial voltage level during a programming duration. The method for determining this pulse includes the following steps:
dynamically measuring the drain current of the memory cell when a rectangular-shaped voltage pulse is applied to the control gate;
providing a transistor equivalent to the memory cell and including a gate electrode and a drain electrode, such that the drain current of the transistor is equal to the drain current of the memory cell when the gate electrode of the transistor is brought to a potential equal to the potential of the floating gate of the memory cell;
dynamically measuring the drain current of the transistor as a function of the potential of the gate electrode of the transistor;
determining the potential of the floating gate during the rectangular-shaped voltage pulse, from the measurement of the drain current of the memory cell and the measurement of the drain current of the transistor;
determining, respectively from the drain current target value, the potential of the floating gate during the rectangular-shaped voltage pulse and from the programming window target value, the initial voltage level, the slope of the voltage ramp and the programming duration, such that the drain current of the memory cell during the optimal voltage pulse is substantially equal to the drain current target value.

Moreover, during the measurement of the drain current of the memory cell, the drain of the memory cell is brought to a constant potential identical to that of the drain electrode of the transistor during the measurement of the drain current of the transistor.

The aforementioned voltage pulses are applied to the control gate of the memory cell. They could thus also be called "gate pulses".

Thanks to this method, a gate pulse allowing to maintain constant programming efficiency throughout programming is obtained. Programming efficiency is taken to mean the ratio between the electrical charge stored in the floating gate and that "lost" in the drain. Constant efficiency is reflected in constant gate and drain currents. This makes it possible notably to fully benefit from the capacities of the charge pumps supplying the flash memory cell. The gate current of the floating gate transistor is the current of electrons through the tunnel oxide up to the floating gate. It determines the speed at which the flash memory cell is written.

The optimal gate pulse obviously satisfies the programming parameters of the flash memory cell, in other words the specifications set by the manufacturer of the cell, since it has been determined from these parameters.

This "a priori" determination of the optimal pulse, that is to say of the initial voltage level of the ramp, the slope of the ramp and the programming duration, is made possible thanks to the fact that an equivalent transistor is used for measuring the potential of the floating gate of the memory cell. As soon as the potential of the floating gate is known, several methods, graphic or digital, allow to determine the slope and the duration of the optimal pulse.

The method of determination according to the invention may also have one or more of the characteristics below, considered individually or according to any technically possible combinations thereof:
the initial voltage level is determined from the Measurement of the drain current of the memory cell at the start of the rectangular-shaped voltage pulse, by measuring the value of the potential applied to the control gate of the memory cell for which the drain current is equal to the drain current target value of the memory cell;
the slope of the voltage ramp is determined from the derivative of the potential of the floating gate, when the potential of the floating gate reaches a floating gate potential target value corresponding to the drain current target value;

the programming duration is determined from the programming window target value and from the slope of the voltage ramp; and the transistor equivalent to the memory cell to program is comprised of a test flash memory cell, of identical geometry to the flash memory cell to program, having a floating gate and a control gate in short-circuit.

Another aspect of the invention relates to a computer program product comprising instructions for implementing the method for determination described above, when it is executed by a computer.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures. Furthermore, in some of the figures, the currents and electrical potentials are expressed in arbitrary units (a.u.).

DETAILED DESCRIPTION OF AT LEAST ONE EMBODIMENT

In the description that follows, a unit EEPROM-Flash memory (i.e. of a capacity of 1 bit) of NOR type is called "flash memory cell". This cell may be embedded in a test circuit, to develop and qualify EEPROM-Flash technology, or constitute the base of a flash memory circuit. A flash memory circuit, or memory array, includes a plurality of these memory cells arranged in lines and columns. NOR-type EEPROM-Flash memory circuits today equip numerous electronic devices, for example mobile telephones, for storing all types of information, in particular programs.

As described previously (FIG. 1), a flash memory cell is provided with a transistor including a control gate, a floating gate, drain and source regions formed in a semiconductor substrate. The control gate, the drain, the source and the substrate constitute control electrodes, noted respectively G, D, S and B. These electrodes allow to bias the transistor to carry out programming (or writing), erasing or reading operations of the memory cell. The potential of an electrode or the current passing through an electrode will be noted hereafter by the appropriate symbol of the potential or the current (V or I), followed by the letter designating the electrode. For example, "Vg" designates the potential of the control gate G and "Id" designates the current in the drain electrode D.

In this flash memory cell, the potential $V_{FG}(t)$ of the floating gate over time depends on the polarizations $Vg(t)$ and $Vd(t)$ of the transistor—respectively on the control gate G and on the drain D—and the charge of electrons $Q_{FG}(t)$ in the floating gate. It is written:

$$V_{FG}(t) = \alpha_G \cdot Vg(t) + \alpha_D \cdot Vd(t) + \frac{Q_{FG}(t)}{C_{tot}} \quad (1)$$

In the above relation, $\alpha_G$ and $\alpha_D$ are respectively the coupling factors of the control gate and drain (fixed by the architecture of the cell), and $C_{tot}$ is the total capacitance of the cell.

Figure 2:
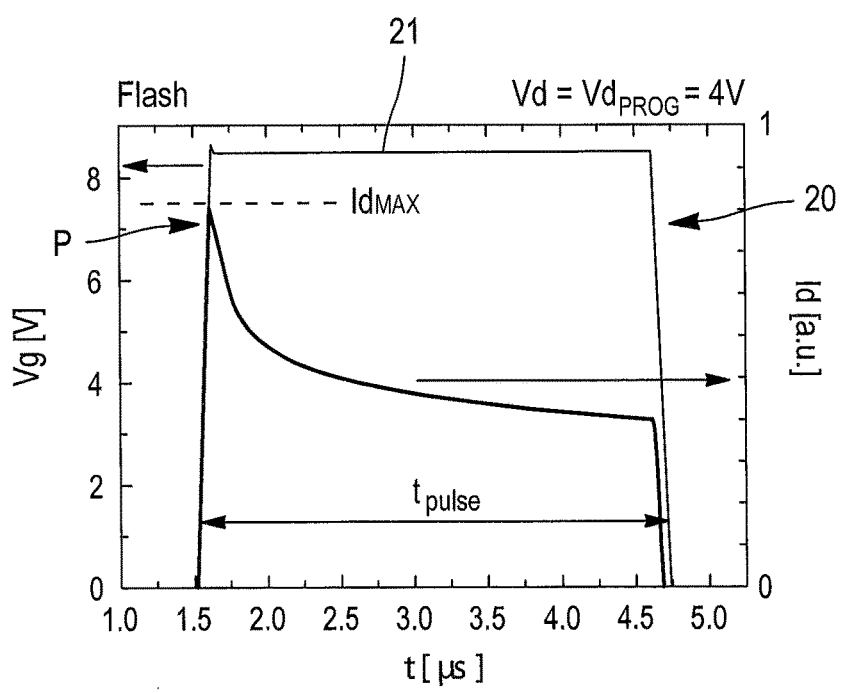
FIG. 2, described previously, represents the drain current and the gate voltage of the cell of FIG. 1 as a function of time, during a conventional programming of this cell.

Thus, when the cell is normally programmed at a constant potential $Vd(t)$ ($Vd(t)=Vd_{PROG}$) and at a constant potential $Vg(t)$, the evolution of the potential $V_{FG}(t)$ of the floating gate only depends on the charge of electrons $Q_{FG}(t)$ in the floating gate. The reduction in this charge (or its increase in absolute value, the charge $Q_{FG}(t)$ being negative) during the programming thus causes a reduction in the potential $V_{FG}(t)$ of the floating gate. This explains on the one hand the increase in the threshold voltage of the floating gate transistor and on the other hand the reduction in the drain current $Id(t)$, when a rectangular gate pulse is applied to the gate electrode (FIG. 2).

Rather than applying a rectangular gate pulse, it is wished to apply to the control gate of the memory cell a voltage pulse allowing to maintain constant programming efficiency during the entire programming duration, in other words constant drain $Id(t)$ and gate $Ig(t)$ currents during programming. A constant drain current $Id(t)$ implies a constant potential $V_{FG}(t)$ of the floating gate. The following equation (drawn from the preceding relationship (1)) ensues:

$$\frac{dV_{FG}(t)}{dt} = 0 = \alpha_G \cdot \frac{dVg(t)}{dt} + \frac{1}{C_{tot}} \frac{dQ_{FG}(t)}{dt} \quad (2)$$

hence:

$$\frac{dVg(t)}{dt} = -\frac{1}{\alpha_G \cdot C_{tot}} \cdot \frac{dQ_{FG}(t)}{dt} = -\frac{Ig(t)}{\alpha_G \cdot C_{tot}} = cte$$

It thus appears that a linear increase of the potential $Vg(t)$ during programming is necessary to ensure constant programming efficiency.

Figure 3:
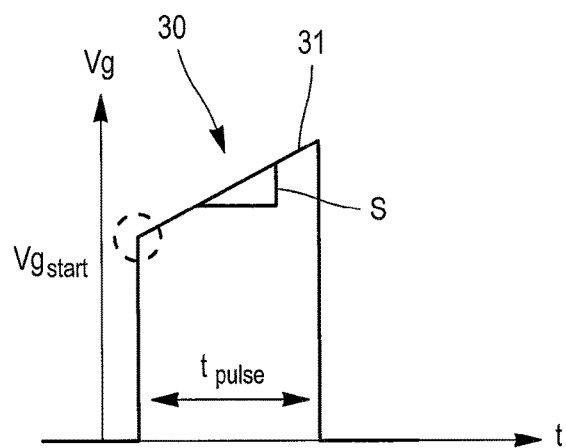
FIG. 3 represents a voltage pulse allowing to program the flash memory cell in an optimal manner.

FIG. 3 shows the shape of the gate pulse 30 enabling this optimal programming of the flash memory cell. The pulse 30 includes, from a non-zero initial voltage level $Vg_{start}$, a ramp 31 of positive slope S. The duration of the pulse 30, noted $t_{pulse}$, is the programming duration and corresponds to the time period t where the potential Vg is non-zero, that is to say to the duration of the ramp 31.

This shape of gate pulse allows to compensate the reduction in charge $Q_{FG}$ in the floating gate linked to the trapping of electrons, during the programming of the memory cell. In fact, by progressively increasing the potential Vg(t) applied to the control gate of the memory cell, the value of the parameter $\alpha_G \cdot Vg(t)$ is increased in the potential relationship $V_{FG}(t)$ (relationship (1)).

Determining the optimal gate pulse 30 to program the flash memory cell consists in determining the slope S of the ramp, the initial voltage level $Vg_{start}$ and the duration of the pulse $t_{pulse}$, fixing as objective reaching a target value of the programming window, noted $PW_{TG}$, and the drain current target value $Id_{TG}$ (that is to say the value at which it is wished to maintain the drain current Id(t)). At least one of these parameters, the slope S, requires determining beforehand the potential $V_{FG}(t)$ of the floating gate during conventional programming. "Conventional programming" is taken to mean programming by means of a rectangular-shaped gate pulse.

The determination of the potential $V_{FG}(t)$ is based on the use of a transistor equivalent to the memory cell of which it is wished to optimize the programming.

Figure 1:
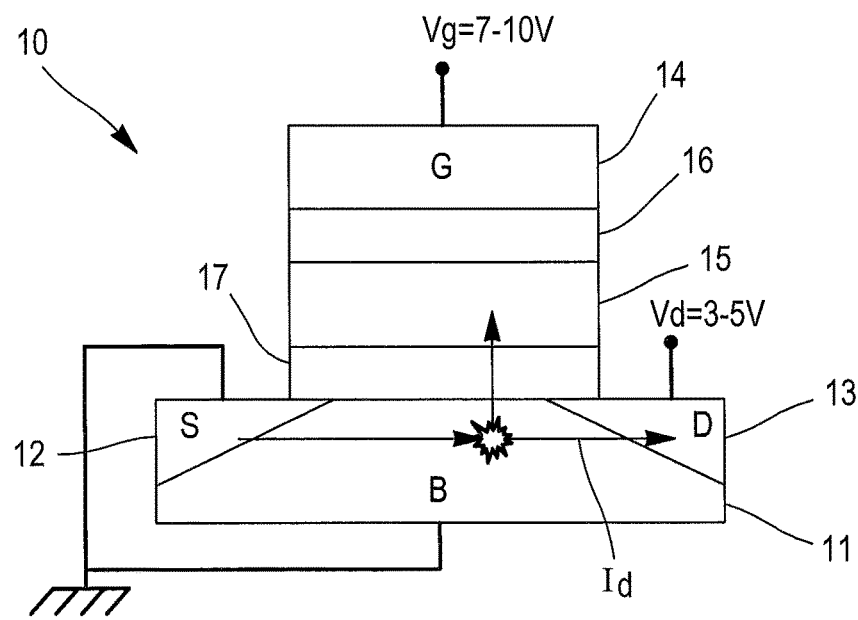
FIG. 1, described previously, represents a flash memory cell according to the prior art.
Figure 4:
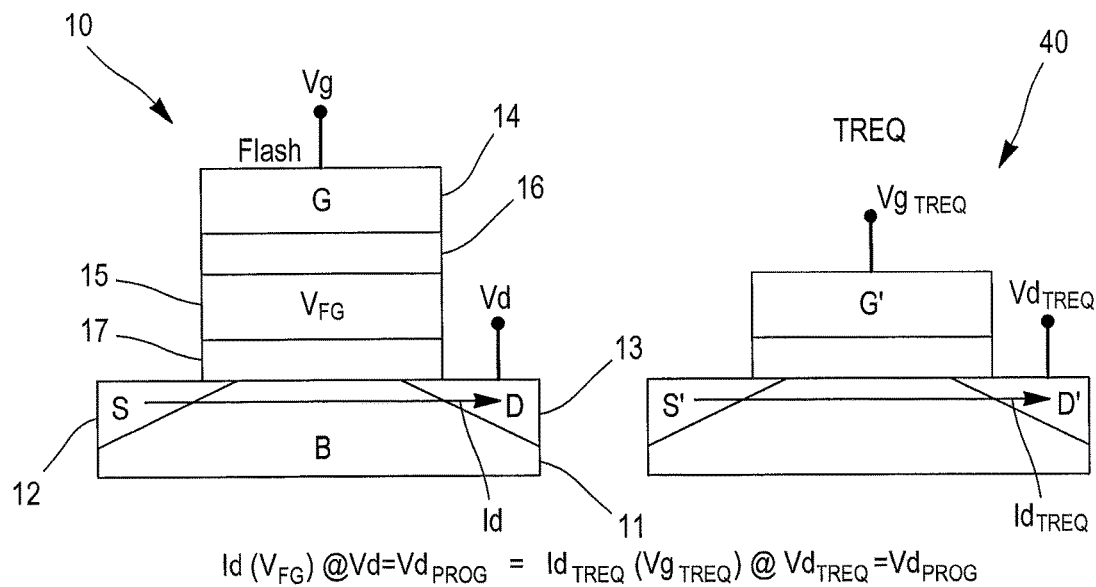
FIG. 4 represents the flash memory cell of FIG. 1 and a transistor equivalent to this flash memory cell.

FIG. 4 schematically represents this equivalent transistor 40 (also called TREQ), at the sides of the flash memory cell 10 of FIG. 1. Like the memory cell 10, the transistor 40 includes a gate electrode G' and a drain electrode D'. The transistor 40 is configured such that its drain current $Id_{TREQ}$ is equal to the drain current Id of the memory cell 10, when the gate electrode G' of the transistor 40 is brought to a potential $Vg_{TREQ}$ equal to the potential of the floating gate $V_{FG}$ of the memory cell 10 and when the drain electrode D' of the transistor 40 is brought to the same potential as the drain of the cell 10 ($Vd=Vd_{TREQ}=Vd_{PROG}$).

The equivalent transistor 40 is, preferably, comprised of a test flash memory cell, of identical geometry to the flash memory cell 10, and in which the floating gate and the control gate are in short-circuit. The floating gate and the control gate of this reference cell thus form the gate electrode G' of the equivalent transistor 40.

Figure 5A:
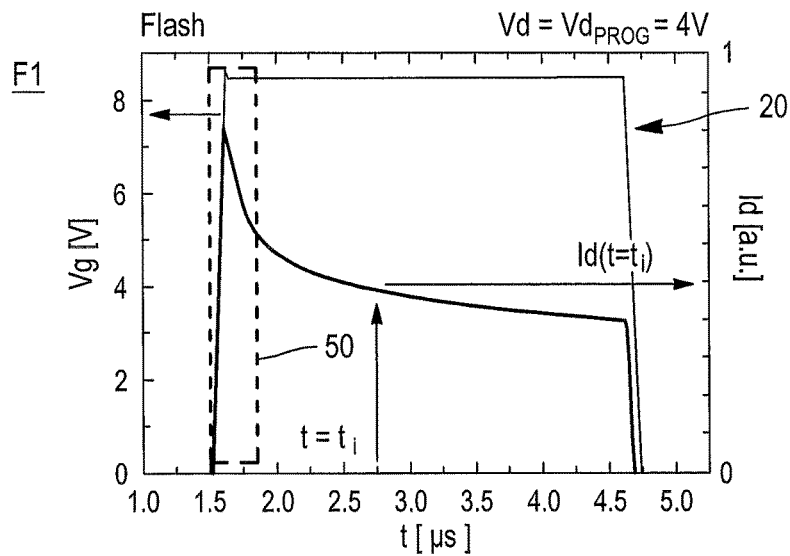
FIGS. 5A to 5C represent the steps of a method for determining an optimal voltage pulse according to the invention, allowing to determine the potential of the floating gate of the flash memory cell during conventional programming.
Figure 5B:
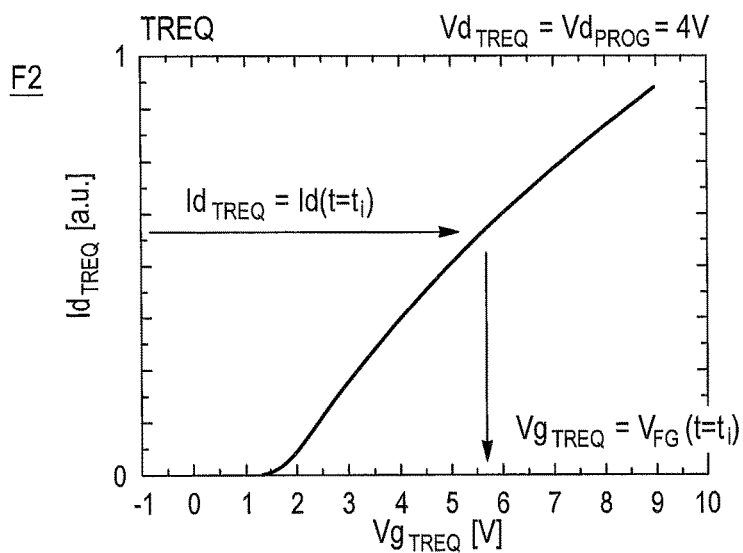
Figure 5C:
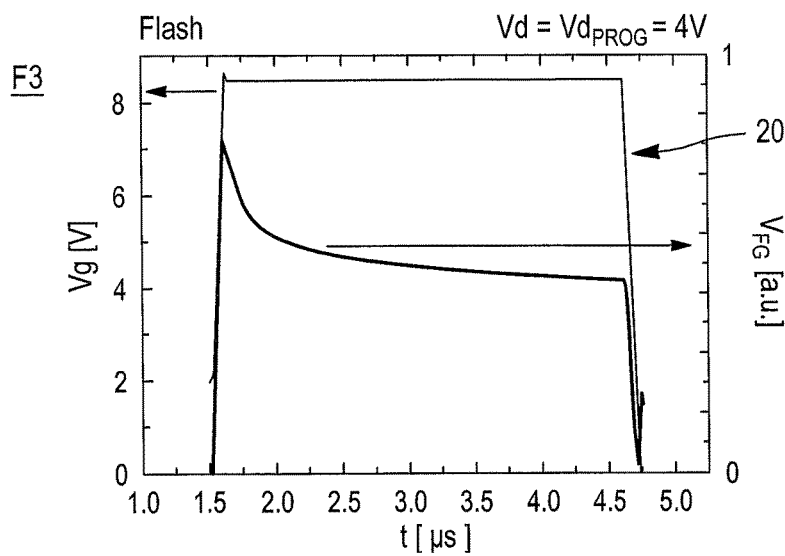

FIGS. 5A to 5C represent three steps F1 to F3 of a method for determining the optimal gate pulse 30 of FIG. 3, taking account of the programming parameters $PW_{TG}$ and $Id_{TG}$. These steps F1 to F3 aim to determine, using the equivalent transistor 40, the potential $V_{FG}(t)$ of the floating gate during conventional programming of the memory cell 10.

At step F1 of FIG. 5A, the drain current Id of the flash memory cell 10 is measured dynamically, while a rectangular voltage pulse 20 is applied to the gate electrode of the cell (potential Vg(t)). The drain of the memory cell is brought to a potential $Vd_{PROG}$, for example equal to 4 V, at least during the entire duration of the pulse 20. This measurement is carried out preferably using a PIV (Pulsed I-V system) or FMU (Fast Measurement Unit) appliance, by plotting for example a point every 10 ns. The FMU model "B1530" marketed by the firm "Keysight Technologies" or the PIV model "4225-RPM" marketed by the firm "Keithley Instruments" may be cited as examples.

Besides, in F2, the drain current $Id_{TREQ}$ of the equivalent transistor 40 is measured as a function of its gate potential $Vg_{TREQ}$. This measurement is also carried out in a dynamic manner, and preferably in the same conditions as the measurement of step F1 (same appliance, same sampling duration, etc.). Moreover, the drain D' of the transistor 40 is brought to the same potential $Vd_{PROG}=4$ V as previously.

Since the two measurements are independent, step F1 and step F2 may be carried out in any order.

Step F3 represented in FIG. 5C consists in determining the potential of the floating gate $V_{FG}(t)$ during the gate pulse 20, from the measurement F1 of the drain current Id(t) of the memory cell 10 (FIG. 5A) and the characteristic $Id_{TREQ}$ ($Vg_{TREQ}$) of the transistor measured at step F2 (FIG. 5B). To do so, it is possible to determine the drain current $Id(t=t_i)$ corresponding to a given time $t_i$ on the plot of FIG. 5A, reporting this current on the characteristic $Id_{TREQ}$ $Vg_{TREQ}$ of FIG. 5B and deducing therefrom the corresponding potential $Vg_{TREQ}$. Knowing that the current Id of the flash memory cell 10 is equal to the current $Id_{TREQ}$ of the transistor 40 if and only if the potential $V_{FG}$ of the floating gate is equal to the gate potential $Vg_{TREQ}$ of the transistor (FIG. 4), this enables to obtain the value of the floating gate potential $V_{FG}$ at time $t_i$ ($V_{FG}(t=t_i)$). By repeating these operations for several time values t, the curve $V_{FG}(t)$ representing the floating gate potential as a function of time is reconstructed point by point.

In other words, the characteristic $Id_{TREQ}(Vg_{TREQ})$ of FIG. 5B allows to establish the link between the drain current Id(t) of the memory cell 10 and the potential $V_{FG}(t)$ of the floating gate.

Finally, during a final step of the method, the characteristics of the optimal gate pulse 30 are determined, namely the gate potential $Vg_{start}$ at the start of the ramp 31, the slope S of the ramp 31 and the duration of the pulse $t_{pulse}$, such that the drain current Id of the flash memory cell during optimal programming reaches the target value $Id_{TG}$ and that the programming window of the cell is equal to the target value $PW_{TG}$.

Figure 6:
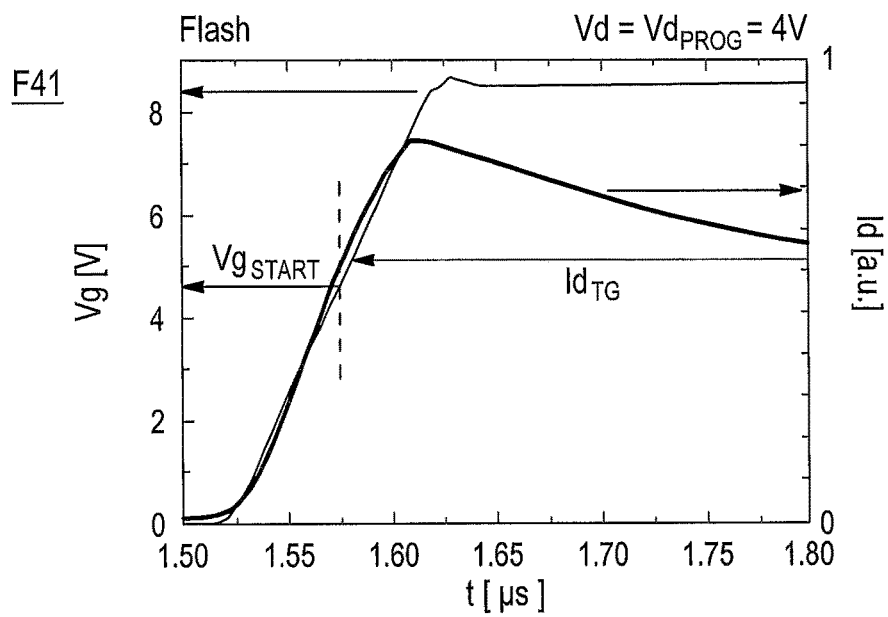
FIG. 6 represents a step allowing to determine the initial voltage level of the pulse of FIG. 3, according to a preferential embodiment of the method according to the invention.

In a preferential embodiment of the determining method, this final step is broken down into three sub-steps, of which two are represented by FIGS. 6 and 7, each of these sub-steps aiming to determine one of these characteristics.

The initial voltage level $Vg_{start}$ is the value of the potential Vg to apply to the control gate of the memory cell at the start of programming, i.e. in the absence or almost absence of electrical charges in the floating gate, in order to obtain a drain current Id equal to the target value $Id_{TG}$. It is thus advisable to establish the link between the drain current Id and the potential Vg when the cell is in the erased state.

This link is given directly by the measurement F1 of the drain current Id(t) of the flash memory cell, when the memory cell is programmed in a conventional manner (FIG. 5A). Thus, at step F41 of FIG. 6, the initial voltage level $Vg_{start}$ is advantageously determined from the measurement of the drain current Id(t) at the start of the rectangular gate pulse 20, by notting the value of the gate potential Vg for which the drain current Id is equal to the drain current target value $Id_{TG}$.

FIG. 6 is a graph representing both the drain current Id(t) and the gate potential Vg(t) (like FIG. 5A), during a time period corresponding to the start of the rectangular pulse 20 (this period being marked by a frame 50 in dotted lines in FIG. 5A).

This graph allows to determine simply the initial voltage level $Vg_{start}$ of the optimal pulse 30. The drain current target value $Id_{TG}$ is firstly reported on this graph, to determine the instant t of conventional programming where the drain current Id of the floating gate is equal to the target value $Id_{TG}$. Then, the gate potential Vg at this same instant is determined, it is equal to the initial voltage level $Vg_{start}$.

As indicated previously, the slope S of the optimal gate pulse 30 (FIG. 3) allows to compensate the reduction in the charge $Q_{FG}$ in the floating gate which occurs during conventional programming, in order that the drain current Id is maintained at the target value $Id_{TG}$. The slope S being the time derivative of the gate potential Vg(t), its expression is directly given by the equation (2):

$$S = \frac{dVg(t)}{dt} = -\frac{Ig(t)}{\alpha_G \cdot C_{tot}} = -\frac{Ig_{TG}}{\alpha_G \cdot C_{tot}}$$

where $Ig_{TG}$ is the value which the gate current Ig takes during the programming of the memory cell ($Ig(t) = cte = Ig_{TG}$), this value being called hereafter "gate current target value".

The gate current Ig(t) during conventional programming is written:

$$Ig(t) = C_{tot} \cdot \frac{dV_{FG}(t)}{dt}$$

The gate current target value $Ig_{TG}$ is thus equal to the total capacitance $C_{tot}$ of the memory cell multiplied by the derivative of the potential of the floating gate $V_{FG}(t)$, at an instant t of conventional programming where the potential of the floating gate $V_{FG}(t)$ reaches a value $V_{FG-TG}$—known as floating gate potential target value—corresponding to the drain current target value $Id_{TG}$.

The expression of the slope S then becomes:

$$S = -\frac{Ig_{TG}}{\alpha_G \cdot C_{tot}} = -\frac{1}{\alpha_G} \cdot \frac{dV_{FG}(t)}{dt}\bigg|_{t=t_{V_{FG}(t)=V_{FG-TG}}}$$

Thus, in the preferential embodiment of the determining method, the slope S may be determined simply and rapidly from the derivative of the potential of the floating gate $V_{FG}(t)$ when this is equal to the target value $V_{FG-TG}$, either by calculation using the above equation, or graphically by means of the plot of the floating gate potential $V_{FG}(t)$.

Figure 7A:
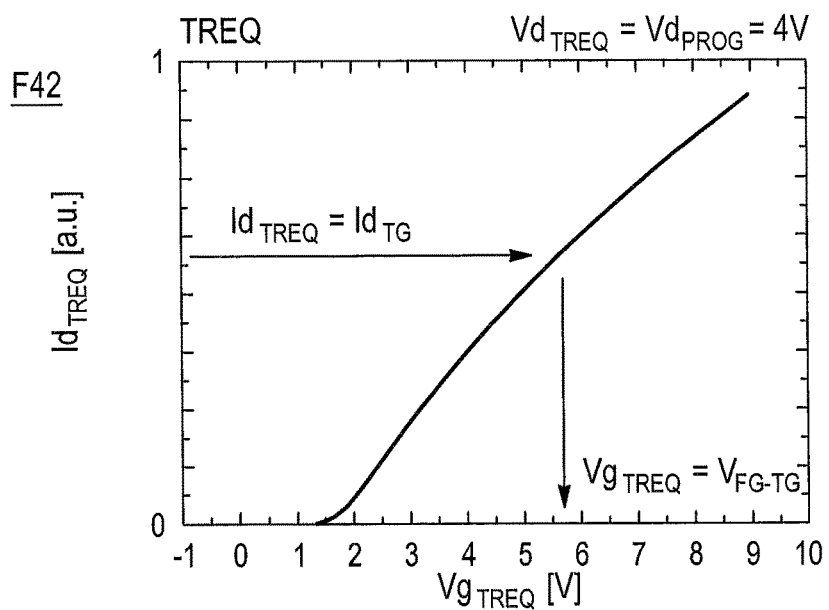
FIGS. 7A and 7B represent steps allowing to determine the slope of the ramp in the pulse of FIG. 3, according to the preferential embodiment of the method according to the invention.

FIG. 7A represents, during a step F42 of the method, a manner for determining this target value $V_{FG-TG}$ of the floating gate potential. As a reminder, when the drain current $Id_{TREQ}$ of the equivalent transistor 40 is equal to the drain current Id of the memory cell 10, this means that the control gate of the transistor and the floating gate of the memory cell are at the same potential (cf. FIG. 4). To determine the target value $V_{FG-TG}$, it thus suffices to note on the characteristic $Id_{TREQ}(Vg_{TREQ})$ of FIG. 5B the potential $Vg_{TREQ}$ for which $Id_{TREQ} = Id_{TG}$ is obtained.

Figure 7B:
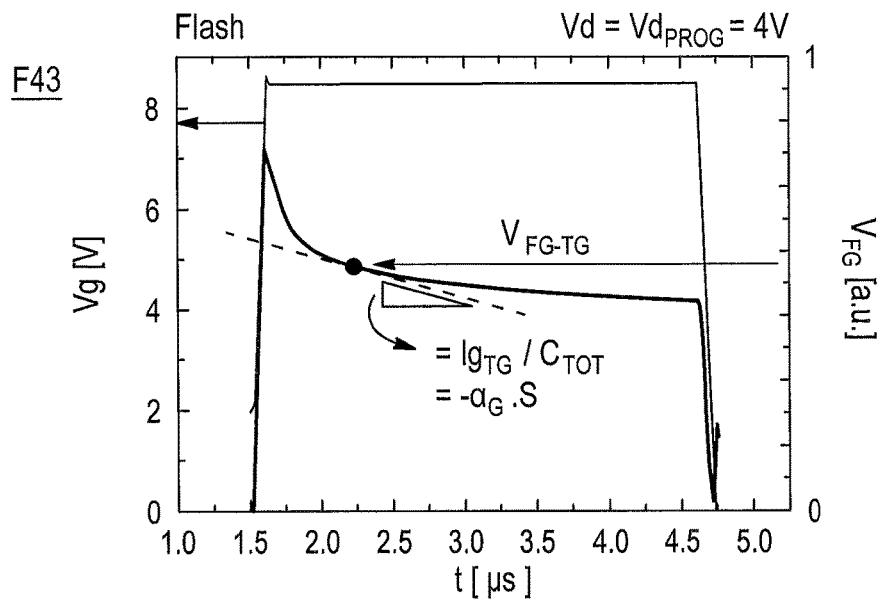

FIG. 7B represents a step F43 of the method in which the slope S is determined graphically from the plot of the floating gate potential $V_{FG}(t)$ obtained at step F3 (FIG. 5C). Firstly the point of the curve $V_{FG}(t)$ having for y-axis the target value $V_{FG-TG}$ is determined, then the slope of the curve $V_{FG}(t)$ at this point is measured to deduce therefrom the slope S (by dividing the slope of the curve $V_{FG}(t)$ by $-\alpha_G$).

The duration $t_{pulse}$ of the optimal pulse 30, in other words the programming duration, influences directly the programming window of the memory cell. The duration $t_{pulse}$ is thus determined from the programming window target value $PW_{TG}$.

The programming window target value $PW_{TG}$ is given by the following relationship:

$$PW_{TG} = PW(t = t_{pulse}) = \frac{-Q_{FG}(t = t_{pulse})}{\alpha_G \cdot C_{tot}} = \frac{-\int_{t_{pulse}} Ig(t) \cdot dt}{\alpha_G \cdot C_{tot}}$$

Since the gate current Ig(t) is assumed constant during the entire programming duration $t_{pulse}$ ($Ig(t) = cte = Ig_{TG}$), the preceding equation is simplified in the form:

$$PW_{TG} = \frac{-t_{pulse} \cdot Ig_{TG}}{\alpha_G \cdot C_{tot}}$$

The duration $t_{pulse}$ of the optimal pulse is thus equal to:

$$t_{pulse} = \frac{-PW_{TG} \cdot \alpha_G \cdot C_{tot}}{Ig_{TG}} = \frac{PW_{TG}}{S}$$

Thus, a simple and rapid way of determining the duration $t_{pulse}$ consists in calculating the ratio between the programming window target value $PW_{TG}$ and the slope S of the voltage ramp, the latter having been thus determined previously at step F43.

Figure 8:
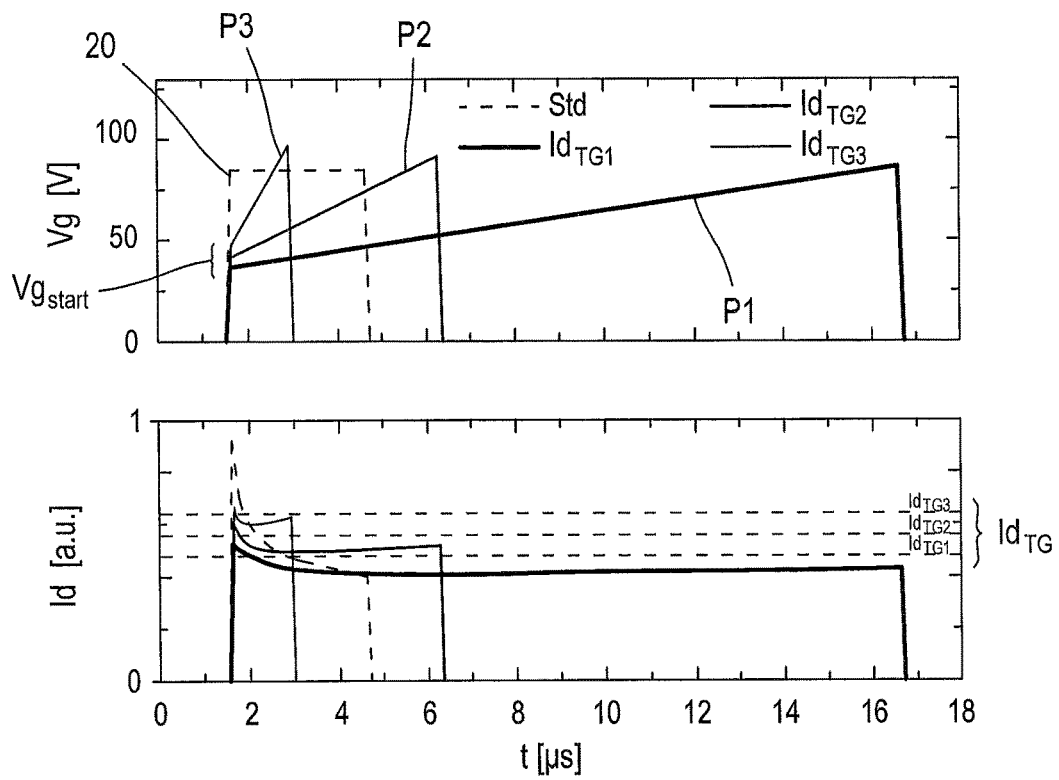
FIG. 8 is an exemplary embodiment of the determining method according to the invention, showing three optimal voltage pulses and the drain current of the memory cell when these pulses serve to program the flash memory cell.

FIG. 8 represents, as an example, three optimal gate pulses P1, P2 and P3 determined thanks to this method according to the invention, as well as the plots of the drain current Id of the flash memory cell during the application of these pulses. As a comparison, the rectangular gate pulse 20 conventionally used to program the flash memory cell and the corresponding drain current Id is represented, i.e. identical curves (at least as regards the shape) to those of FIG. 2.

The pulses P1, P2 and P3 have been determined for one programming window target value $PW_{TG}$ equal to 6 V and for three drain current target values: respectively $Id_{TG1}$, $Id_{TG2}$ and $Id_{TG3}$ (with $Id_{TG1} < Id_{TG2} < Id_{TG3}$).

The plots of the drain current Id show that, for each optimal pulse P1 to P3, the drain current Id (full line) is substantially constant, unlike the drain current caused by a rectangular pulse 20 (dotted lines). Constant programming efficiency is thus obtained thanks to these optimal pulses. Moreover, the drain current target value $Id_{TG}$ is practically reached for each optimal pulse P1 to P3. The difference between the drain current Id(t) and the corresponding target value $Id_{TG}$ observed in these examples can be attributed to the variations in performances from one memory cell to the next (due to the variability of the manufacturing method). These variations here concern the programmed memory cell and the equivalent transistor having served in the determination of the optimal pulses P1-P3, itself comprised of a flash memory cell. The difference between the target value $Id_{TG}$ and the real value of the drain current Id(t) is less than 10 μA. The method for determination is thus satisfactory in terms of precision.

As may be seen in FIG. 8, the initial voltage level $Vg_{start}$ varies from one optimal pulse to the next, according to the value of the targeted drain current $Id_{TG}$. In fact, the higher the desired drain current, the higher the initial bias of the floating gate transistor. In the same way, the slope of the ramp increases with the target value $Id_{TG}$, because a strong drain current has a tendency to reduce more rapidly than a weak drain current. On the other hand, the memory cell is indeed written more rapidly with a strong drain current, for example equal to $Id_{TG3}$, than with a weak drain current, for example equal to $Id_{TG1}$. It is thus normal, for a same programming window target value, that the pulse P3 has a shorter duration than the pulse P1.

Certain of the steps of the method above, in particular step F3 and the step that follows it, may be executed by a software. This software determines, from measurements of drain current on the flash memory cell (step F1) and on the equivalent transistor (step F2), the optimal gate pulse which satisfies the programming parameters $Id_{TG}$ and $PW_{TG}$ entered by the user in the software. Thanks to this software, it is possible to simulate rapidly a large number of optimal pulses, using the same measurements of drain current on the cell and on the equivalent transistor. A single operation of conventional programming of the memory cell is thus necessary. The software is, preferably, installed on a computer connected to the PIV or FMU measurement appliance. Thus, the computer executes a program which controls the measurement appliance for carrying out dynamic current measurements, recovers the measurement data, and compiles these data, for example by means of a processor, to determine the optimal voltage pulse.

Figure 9:
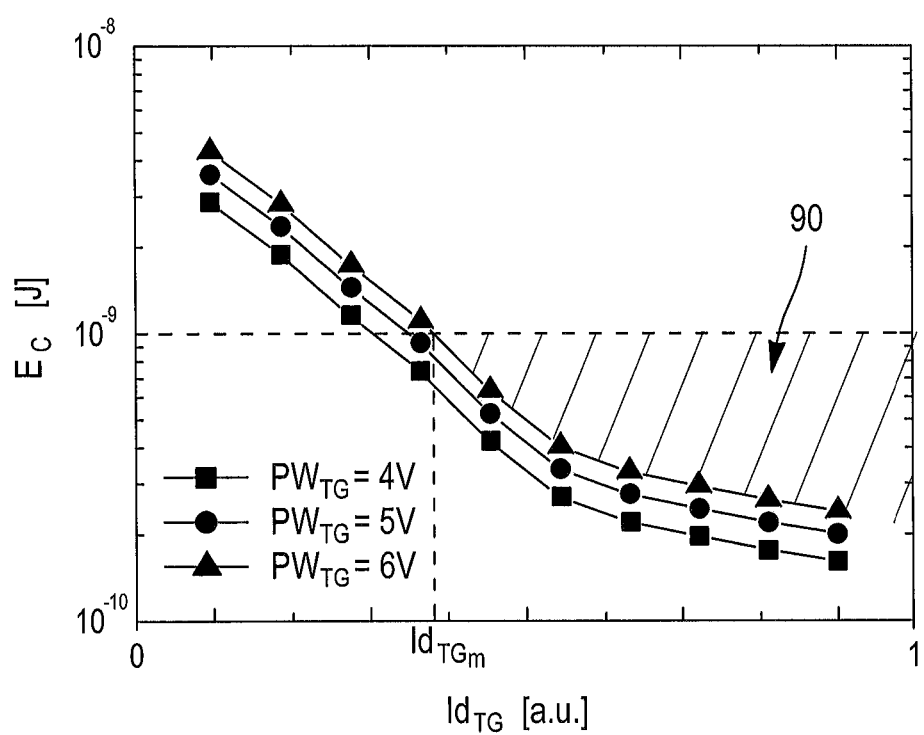
FIG. 9 is an abacus representing the compromise between the performances of the flash memory cell, in terms of electrical consumption, drain current and programming window.

FIG. 9 is an abacus of performances of a flash memory cell established thanks to the determining method according to the invention. It represents the energy Ec consumed by the memory cell during its programming as a function of the drain current target value $Id_{TG}$ (in general the value of the drain current not to exceed), and for several programming window target values $PW_{TG}$. Each point of this abacus is obtained by determining the optimal pulse corresponding to a given pairing $\{Id_{TG}; PW_{TG}\}$, then by calculating the energy consumed Ec by the memory cell when it is programmed with this pulse. The energy consumed Ec is calculated by determining the integral of the drain current Id(t) multiplied by the drain potential Vd(t) of the cell over the entire pulse duration $t_{pulse}$.

This type of abacus thus represents the compromise between the programming window $PW_{TG}$, the energy consumption Ec and the maximum drain current $Id_{TG}$ of the memory cell. It enables flash memory manufacturers to choose the optimal gate pulse, as a function of the specifications to comply with. Each curve of the abacus delimits a forbidden operating zone (below the curve) and an authorized operating zone (above the curve). For example, if the manufacturer desires a programming window $PW_{TG}$ of at least 6 V and a consumed energy Ec not exceeding 1 nJ, the maximum drain current $Id_{TG}$ cannot be lower than the value $Id_{TGmin}$. The manufacturer must choose an optimal pulse for which the compromise $PW_{TG}/Ec/Id_{TG}$ belongs to the hatched zone 90 in FIG. 9.

The invention is claimed is:

1. A method for determining an optimal voltage pulse for programming a NOR-type flash memory cell comprising a floating gate, a control gate and a drain, said optimal voltage pulse, to be applied to the control gate of the memory cell, being defined by a voltage ramp from a non-zero initial voltage level during a programming duration, the method comprising:

providing a set of parameters including a programming window target value and a drain current target value of the memory cell;

dynamically measuring a drain current of the memory cell when a rectangular-shaped voltage pulse is applied to the control gate;

providing a transistor equivalent to the memory cell and comprising a gate electrode and a drain electrode, such that the a drain current of the transistor is equal to the drain current of the memory cell when the gate electrode of the transistor is brought to a potential equal to the a potential of the floating gate of the memory cell;

dynamically measuring the drain current of the transistor as a function of the potential of the gate electrode of the transistor;

determining the potential of the floating gate during the rectangular-shaped voltage pulse, from the measurement of the drain current of the memory cell and the measurement of the drain current of the transistor;

determining, respectively from the drain current target value, the potential of the floating gate during the rectangular-shaped voltage pulse and from the programming window target value, the initial voltage level, a slope of the voltage ramp and the programming duration, such that the drain current of the memory cell during the optimal voltage pulse is substantially equal to the drain current target value;

and wherein the drain of the memory cell is brought, during the measurement of the drain current of the memory cell, to a constant potential identical to that of the drain electrode of the transistor during the measurement of the drain current of the transistor.

2. The method according to claim 1, wherein the initial voltage level is determined from the measurement of the drain current of the memory cell at a start of the rectangular-shaped voltage pulse, by measuring the value of the potential applied to the control gate of the memory cell for which the drain current is equal to the drain current target value of the memory cell.

3. The method according to claim 1, wherein the slope of the voltage ramp is determined from the derivative of the potential of the floating gate, when the potential of the floating gate reaches a floating gate potential target value corresponding to the drain current target value.

4. The method according to claim 1, wherein the programming duration is determined from the programming window target value and from the slope of the voltage ramp.

5. The method according to claim 4, wherein the programming duration is calculated using the following relationship:

$$t_{pulse} = PW_{TG}/S$$

where $PW_{TG}$ is the programming window target value and S is the slope of the voltage ramp.

6. The method according to claim 1, wherein the transistor equivalent to the memory cell to program is comprised of a test flash memory cell, of identical geometry to the flash memory cell to program, having a floating gate and a control gate in short-circuit.

7. A non-transitory computer program product comprising instructions for implementing a method according to claim 1, when executed by a computer.

* * * * *